United States Patent
Wang et al.

(10) Patent No.: US 10,749,065 B2
(45) Date of Patent: Aug. 18, 2020

(54) PREPARATION METHOD AND APPLICATION OF LIGHT-RESPONSIVE LED BASED ON GAN/CSPBBR$_x$I$_{3-x}$ HETEROJUNCTION

(71) Applicant: HUBEI UNIVERSITY, Wuhan, Hubei (CN)

(72) Inventors: Hao Wang, Hubei (CN); Hai Zhou, Hubei (CN); Guokun Ma, Hubei (CN); Zehao Song, Hubei (CN)

(73) Assignee: HUBEI UNIVERSITY, Wuhan, Hubei (CN)

( * ) Notice: Subject to any disclaimer, the term of this patent is extended or adjusted under 35 U.S.C. 154(b) by 0 days.

(21) Appl. No.: 16/616,162

(22) PCT Filed: Feb. 19, 2019

(86) PCT No.: PCT/CN2019/075448
§ 371 (c)(1),
(2) Date: Nov. 22, 2019

(87) PCT Pub. No.: WO2019/165909
PCT Pub. Date: Sep. 6, 2019

(65) Prior Publication Data
US 2020/0144438 A1    May 7, 2020

(30) Foreign Application Priority Data
Feb. 28, 2018   (CN) .......................... 2018 1 0166990

(51) Int. Cl.
*H01L 31/12*    (2006.01)
*H01L 33/00*    (2010.01)
(Continued)

(52) U.S. Cl.
CPC .......... *H01L 31/125* (2013.01); *C01G 21/006* (2013.01); *C09K 11/0883* (2013.01);
(Continued)

(58) Field of Classification Search
CPC ... H01L 33/002; H01L 33/40; H01L 31/0336; C01G 21/006; C09K 11/0883
(Continued)

(56) References Cited

U.S. PATENT DOCUMENTS

2003/0034491 A1   2/2003 Lempkowski et al.
2018/0105743 A1*  4/2018 Dou .................... C09K 11/665
(Continued)

FOREIGN PATENT DOCUMENTS

| CN | 105870287 A | 8/2016 |
| CN | 107416894 A | 12/2017 |
| CN | 108511564 A | 9/2018 |

OTHER PUBLICATIONS

Song et al., All-inorganic perovskite CsPbBr3-based self-powered light emitting photodetectors with ZnO hollow balls as an ultraviolet response center, Journal of Materials Chemistry C, 2018, pp. 5113-5121, vol. 6.
(Continued)

*Primary Examiner* — Igwe U Anya

(57) ABSTRACT

A light-responsive LED (Light Emitting Diode) based on a GaN/CsPbBr$_x$I$_{3-x}$ heterojunction, a preparation method and an application thereof are provided. The light-responsive LED consists of a GaN base layer on a sapphire substrate, an all-inorganic perovskite CsPbBr$_x$I$_{3-x}$ film, an indium electrode and a carbon electrode, forming an In/GaN/CsPbBr$_x$I$_{3-x}$/C structure, wherein: in the CsPbBr$_x$I$_{3-x}$ film, 0<x<3; the all-inorganic perovskite CsPbBr$_x$I$_{3-x}$ film and the indium electrode are arranged on the GaN base layer in parallel; and the carbon electrode is arranged on the all-inorganic perovskite CsPbBr$_x$I$_{3-x}$ film. The CsPbBr$_x$I$_{3-x}$ film is prepared through a low-temperature anti-solvent method. The prepared LED device is able to realize integration of self-powered visible detection and visible luminescence, and able to work as a transmitting terminal or a receiving
(Continued)

terminal in visible light wireless communication, which solves a difficult problem of backward communication in visible light wireless communication technology.

5 Claims, 8 Drawing Sheets

(51) Int. Cl.
    *H01L 33/40*     (2010.01)
    *H01L 31/0336*     (2006.01)
    *C09K 11/08*     (2006.01)
    *C01G 21/00*     (2006.01)
    *H01L 33/26*     (2010.01)
    *H01L 21/66*     (2006.01)
    *H01L 31/18*     (2006.01)
    *C09K 11/66*     (2006.01)

(52) U.S. Cl.
    CPC ............ *C09K 11/665* (2013.01); *H01L 22/10* (2013.01); *H01L 31/0336* (2013.01); *H01L 31/18* (2013.01); *H01L 33/002* (2013.01); *H01L 33/005* (2013.01); *H01L 33/26* (2013.01); *H01L 33/40* (2013.01); *C01P 2002/34* (2013.01); *C01P 2002/72* (2013.01); *C01P 2004/03* (2013.01); *C01P 2006/40* (2013.01)

(58) Field of Classification Search
    USPC .......................................................... 438/14
    See application file for complete search history.

(56) References Cited

U.S. PATENT DOCUMENTS

2018/0208840 A1*   7/2018   Luchinger ................. B01J 2/00
2019/0169498 A1*   6/2019   Saidaminov ......... C09K 11/665

OTHER PUBLICATIONS

Wei et al., Solution-processed highly bright and durable cesium lead halide perovskite light-emitting diodes, Nanoscale, 2016, pp. 18021-18026, vol. 8.

Nuri Oh et al., Double-heterojunction nanorod light-responsive LEDs for display applications, Science, 2017, pp. 616-619, vol. 355.

* cited by examiner

PREPARATION METHOD AND APPLICATION OF LIGHT-RESPONSIVE LED BASED ON GAN/CSPBBR$_x$I$_{3-x}$ HETEROJUNCTION

CROSS REFERENCE OF RELATED APPLICATION

This is a U.S. National Stage under 35 U.S.C 371 of the International Application PCT/CN2019/075448, filed Feb. 19, 2019, which claims priority under 35 U.S.C. 119(a-d) to CN 201810166990.4, filed Feb. 28, 2018.

BACKGROUND OF THE PRESENT INVENTION

Field of Invention

The present invention belongs to a technical field of optical communication, relates to a preparation technology and an application of an optical communication LED (Light Emitting Diode), and more particularly to a light-responsive LED based on a GaN/CsPbBr$_x$I$_{3-x}$ heterojunction, a preparation method and an application thereof.

Description of Related Arts

The visible light wireless communication is known as the LiFi (Light Fidelity) technology, which is a wireless transmission technology for data transmission with utilizing the spectrums of visible light (such as light emitted by the bulb) and is invented by Harald Hass who is the chairman of mobile communication department of electro-communication college of England Edinburgh University and is a physicist. Because of advantages of high rate, no electromagnetic radiation, high density, low cost, rich spectrums and high confidentiality, the LiFi technology is regarded as the next-generation wireless communication technology after WiFi and gains a lot of attentions.

Currently, the LiFi technology has a difficult problem required to be urgently solved, namely the backward communication. The communication from the signal source to the mobile phone is defined as the forward communication, and the communication from the mobile phone to the signal source is the backward communication. The current situation is that the forward communication is easily solved. With the LED as the signal source, the forward communication can be easily realized through adding a photoelectric detector as the receiving terminal on the mobile phone. However, the common photoelectric detector does not have the luminescent property, and the LED does not have the optical detection ability, so that the backward communication cannot be realized. The LED transmits the signal and the photoelectric detector on the mobile phone receives the signal, which only solves half of the problem; only when the signal is able to be transmitted back from the mobile phone, the communication link is ensured to be smooth. That is to say, if the backward communication cannot be effectively solved, the terminal devices such as the mobile phone can only download the data, but cannot update the data, which undoubtedly restricts the development of the LiFi technology. Thus, developing a device having double functions of optical detection and electroluminescence to realize the forward and backward communication of the LiFi technology is a technical problem required to be urgently solved by researchers in field.

In 2017, oh et al. reported a device integrated with double functions of photoelectric detector and light emitting diode [1] on Science. In the report, the great application prospect of the di-functional device was showed, especially the applications in fields of screen luminance control and information communication. Since then, the di-functional device has aroused interests of the researchers. Moreover, in recent years, the halogen family perovskite has showed extraordinary performance in the photoelectric field and is widely applied in the solar cell, photoelectric detector and light emitting diode[2-4]. Among the halogen family perovskite, because of the high stability, the all-inorganic perovskite CsPbBr$_3$ overcomes the shortcomings that the organic-inorganic hybridized perovskite is difficult to be preserved in the atmospheric environment and easily decomposed when heated, and is widely applied in the light emitting diode or photoelectric detector[5-6]. Thus, the high-performance device may be prepared if applying the all-inorganic perovskite CsPbBr$_3$ in the di-functional integrated device.

Conventionally, CsPbBr$_3$ as the luminescent layer is applied in the light emitting diode in forms of three-dimensional polycrystalline film, two-dimensional nanosheet and zero-dimensional quantum dot[7-9]. However, the two-dimensional nanosheet and the zero-dimensional quantum dot have strong quantum restriction effects, which is disadvantageous for exciton separation to realize the optical detection. Moreover, in the previous reports, the thickness and discontinuity of the three-dimensional CsPbBr$_3$ polycrystalline films are problems. To solve the above problems, the present invention devotes to research the preparation method of the three-dimensional CsPbBr$_3$ polycrystalline films, the di-functional devices of photoelectric detection and electroluminescence and its application in visible light wireless communication.

REFERENCE DOCUMENTS

[1] Oh N, Kim B H, Cho S-Y, et al. Science. 2017; 355:616-9;
[2] Shen L, Fang Y, Wang D, et al. Advanced Materials. 2016; 28:10794-800;
[3] He M, Chen Y, Liu H, et al. Chemical Communications. 2015; 51:9659-61;
[4] Jeon N J, Noh J H, Kim Y C, et al. Nature materials. 2014; 13:897-903;
[5] Zhang X, Xu B, Zhang J, et al. Advanced Functional Materials. 2016; 26:4595-600;
[6] Wei Z, Perumal A, Su R, et al. Nanoscale. 2016; 8:18021-6;
[7] Li X, Wu Y, Zhang S, et al. Advanced Functional Materials. 2016; 26:2435-45;
[8] Byun J, Cho H, Wolf C, et al. Advanced Materials. 2016; 28:7515;
[9] Cho H, Jeong S H, Park M H, et al. Science. 2015; 350:1222.

SUMMARY OF THE PRESENT INVENTION

Aiming at above problems in the prior art, objects of the present invention are to provide a light-responsive LED (Light Emitting Diode) based on a GaN/CsPbBr$_x$I$_{3-x}$ heterojunction, a preparation method and an application thereof. The light-responsive LED provided by the present invention shows excellent performances in both two aspects of optical detection and electroluminescence. Therefore, the light-responsive LED provided by the present invention can serve as a transmitting terminal as well as a receiving terminal, which provides an effective solution for LiFi (Light Fidelity) technology to realize two-way communication.

In order to accomplish the first object, the present invention adopts technical solutions as follows.

A light-responsive LED based on a GaN/CsPbBr$_x$I$_{3-x}$ heterojunction consists of a GaN base layer on a sapphire substrate, an all-inorganic perovskite CsPbBr$_x$I$_{3-x}$ film, an indium electrode and a carbon electrode, forming an In/GaN/CsPbBr$_x$I$_{3-x}$/C structure, wherein: in the CsPbBr$_x$I$_{3-x}$ film, 0<x<3; the all-inorganic perovskite CsPbBr$_x$I$_{3-x}$ film and the indium electrode are arranged on the GaN base layer in parallel; and the carbon electrode is arranged on the all-inorganic perovskite CsPbBr$_x$I$_{3-x}$ film.

Preferably, a thickness of the all-inorganic perovskite CsPbBr$_x$I$_{3-x}$ film is 100-300 nm; and more preferably, the thickness is 200 nm.

Preferably, a thickness of the GaN base layer is 2-6 μm; and more preferably, the thickness is 4 μm.

A second object of the present invention is to provide a preparation method for the above light-responsive LED based on the GaN/CsPbBr$_x$I$_{3-x}$ heterojunction, comprising steps of:

(1) selecting a GaN base layer and washing, particularly comprising steps of:

selecting a GaN base layer on a sapphire substrate, and ultrasonically cleaning; then processing with ultraviolet and ozone, and obtaining a preprocessed GaN base layer;

(2) preparing an indium bottom electrode, particularly comprising steps of:

coating molten indium uniformly on one side of the preprocessed GaN base layer obtained through the step (1); cooling to a room temperature, and obtaining the indium bottom electrode;

(3) generating an all-inorganic perovskite CsPbBr$_x$I$_{3-x}$ polycrystalline film with an anti-solvent, particularly comprising steps of:

according to a proportion, successively dissolving all-inorganic perovskite CsPbBr$_3$ powders and CsPbI$_3$ powders in DMSO (dimethylsulfoxide); after standing for 1-3 hours, filtering by a filter, and obtaining a colorless transparent solution; thereafter, dropping a small amount of the colorless transparent solution uniformly on the other side of the GaN base layer; placing the GaN base layer on a spin coater, and running for 40-80 seconds with a rotation speed of 3000-5000 rpm, wherein the anti-solvent is dropped on the GaN base layer after running for 15-30 seconds; placing an obtained sample in an inert atmosphere, and annealing at 80-120° C. for 5-15 minutes; and obtaining the all-inorganic perovskite CsPbBr$_x$I$_{3-x}$ polycrystalline film;

(4) preparing a carbon top electrode, particularly comprising steps of:

with using a mask, blade-coating carbon paste on the CsPbBr$_x$I$_{3-x}$ film obtained through the step (3); placing the sample in an argon atmosphere, and annealing, so as to remove solvent in the carbon paste; and (5) testing, particularly comprising steps of:

after finishing testing, obtaining a complete LED device.

Preferably, in the step (3), a weight ratio of the CsPbBr$_3$ powders to the CsPbI$_3$ powders is 1:0, 1:1, 1:3, or 0:1.

Preferably, in the step (3), the anti-solvent is ethyl ether, ethyl acetate, or methylbenzene; more preferably, the anti-solvent is methylbenzene.

Preferably, in the step (3), a standing time is 2 hours, and a pore size of the filter is 0.22 μm.

Preferably, in the step (3), the rotation speed of the spin coater is 4000 rpm, a running time is 60 seconds, and the anti-solvent of methylbenzene is dropped on the GaN base layer after running for 25 seconds.

Preferably, in the step (3), an annealing temperature is 100° C., an annealing time is 10 minutes, and an adopted inert gas is argon.

Preferably, in the step (3), the all-inorganic perovskite CsPbBr$_3$ powders are prepared through steps of:

dissolving PbBr$_2$ in an appropriate amount of HBr, heating and stirring until fully dissolved, and obtaining a solution A; dissolving CsBr in an appropriate amount of deionized water, heating and stirring until fully dissolved, and obtaining a solution B; rapidly adding the solution B into the solution A, stirring until completely reacted, and obtaining yellow powdery precipitates; washing the precipitates with methyl alcohol or ethyl alcohol; after suction filtration, annealing obtained powders in an inert atmosphere at 60-80° C. for 20-40 minutes, so as to remove the residual methyl alcohol or ethyl alcohol, and obtaining the all-inorganic perovskite CsPbBr$_3$ powders.

Further preferably, a molar ratio of PbBr$_2$ to CsBr is 1:2.

A third object of the present invention is to provide an application of the above light-responsive LED based on the GaN/CsPbBr$_x$I$_{3-x}$ heterojunction. In this case, the LED can work as a transmitting terminal or a receiving terminal in the visible light wireless communication.

A wireless communication system comprises an optical signal transmitting terminal and an optical signal receiving terminal, wherein the optical signal transmitting terminal and/or the optical signal receiving terminal is the above light-responsive LED based on the GaN/CsPbBr$_x$I$_{3-x}$ heterojunction.

Compared with the prior art, the advantages and beneficial effects of the present invention are described as follows.

(1) The present invention adopts a low-temperature solution method and utilizes the low boiling point characteristic of the anti-solvent of methylbenzene, so as to effectively remove the DMSO and obtain the high-quality all-inorganic perovskite CsPbBr$_x$I$_{3-x}$ polycrystalline film.

(2) The present invention adopts indium as the bottom electrode, n-GaN as the electron transfer layer, i-type all-inorganic perovskite CsPbBr$_x$I$_{3-x}$ as the active layer, and carbon electrode as the top electrode, so as to construct the light-responsive LED based on the GaN/CsPbBr$_x$I$_{3-x}$ heterojunction. The constructed GaN/CsPbBr$_x$I$_{3-x}$ heterojunction is able to realize integration of self-powered visible detection and visible luminescence. When no external bias is applied, with utilizing the photovoltaic properties of the heterojunction, the excitons are separated in the all-inorganic perovskite CsPbBr$_x$I$_{3-x}$, so that the optical detection in a wavelength range of 350-550 nm is realized. Under the forward bias, the excitons are recombined in the all-inorganic perovskite CsPbBr$_x$I$_{3-x}$, and the pure green light is transmitted. Therefore, with utilizing the di-functional characteristics of the device, the difficult problem of backward communication in the visible light wireless communication technology (LiFi technology) is solved.

(3) The present invention adopts the carbon electrode, which avoids the usage of the expensive hole transporting material and reduces the cost of the device fabrication.

(4) The present invention utilizes the high chemical stability of GaN. The used LED device can be recycled; and after simple treatment, GaN can be reused, which accords with the development trend of renewable economy.

DETAILED DESCRIPTION OF THE PREFERRED EMBODIMENT

Figure 1:
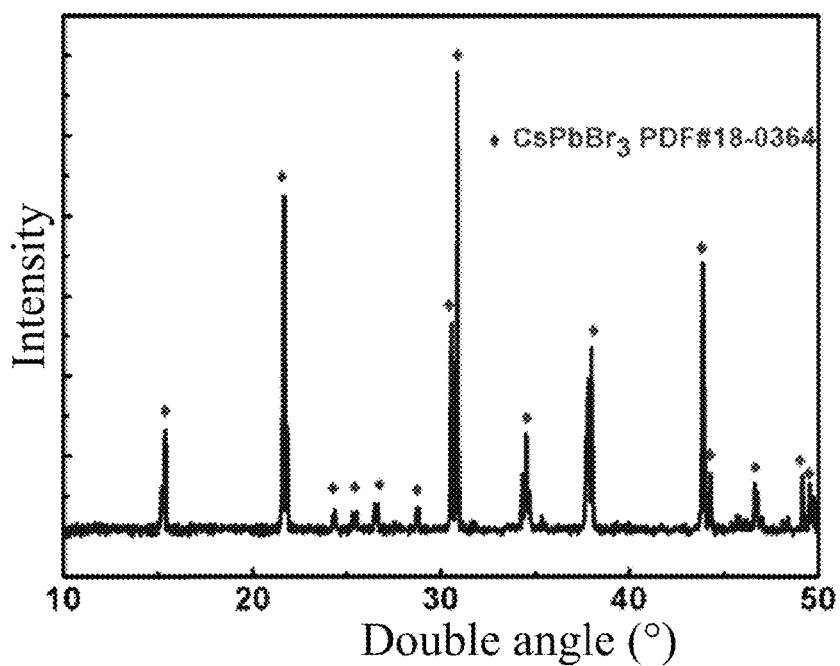
FIG. 1 shows XRD (X-Ray Diffraction) patterns of all-inorganic perovskite CsPbBr$_3$ powders prepared in examples 1-3.

Technical solutions of the present invention are further illustrated in detail with examples and accompanying drawings. The following examples are merely preferred examples of the present invention, not for limiting the present invention in other forms. One skilled in the art can modify the above disclosed technical content into the equivalent example. The simple modifications and equivalent changes on the following examples based on the technical essence of the present invention without departing from the technical solutions of the present invention are all encompassed in the protection scope of the present invention.

Based on correlated theories in background technology, prior art and related material characteristics, it is found that: the CsPbBr$_3$ polycrystalline film prepared through the conventional method is relatively thin, generally below 100 nm, which is disadvantageous for effective absorption of light, mainly caused by the low solubility of CsX(Cl, Br, I) in the solvents of DMF (Dimethyl Formamide) and DMSO (dimethylsulfoxide). Zhanhua Wei et al. disclosed a solution of dissolving the prepared CsPbBr$_3$ powders in DMSO, so as to improve the solubility. Considering the high boiling point characteristic (189° C.) of DMSO, in low-temperature preparation, the DMSO cannot be effectively removed, causing that the film easily has a secondary phase and the quality of the film is decreased. Therefore, a solution of synthesizing with an anti-solvent is provided, which is able to effectively remove the residual DMSO solvent and obtain the high-quality polycrystalline film.

The tests of morphology and crystal structure in the following examples are respectively made by a field emission SEM (Scanning Electron Microscope) (JSM-7100F) and an XRD (X-Ray Diffraction) (Bruker D8 Advance CuKa radiation). The photoelectric properties of the device are tested by an Agilent B1500a. The electroluminescence spectrograms of the device are tested by a Princeton Instruments Acton SP2500. Test analysis results thereof are respectively showed in figures.

In following examples 1-3, when synthesizing all-inorganic perovskite CsPbBr$_3$ powders, in order to inhibit generation of perovskite-like CsPb$_2$Br$_5$, an excessive amount of CsBr is required to be added.

Example 1

Synthesis of All-Inorganic Perovskite CsPbBr$_3$ Powders (with a Molar Ratio of CsBr to PbBr$_2$ being 2:1)

According to the first example, the all-inorganic perovskite CsPbBr$_3$ powders are prepared through steps of:

dissolving 10 mmol PbBr$_2$ in 30 ml HBr, stirring at 50° C. for 10 minutes until fully dissolved, and obtaining a solution A1; dissolving 20 mmol CsBr in 10 ml deionized water, stirring at 50° C. for 10 minutes until fully dissolved, and obtaining a solution B1; rapidly adding the solution B1 into the solution A1, stirring for 1 minute until completely reacted, and observing that yellow powders are precipitated at bottom of the beaker; washing the obtained precipitates with methyl alcohol; after suction filtration, obtaining the pure all-inorganic perovskite CsPbBr$_3$ powders; annealing the obtained powders in an inert atmosphere at 70° C. for 30 minutes, so as to remove the residual methyl alcohol, and obtaining the dry i-type all-inorganic perovskite CsPbBr$_3$ powders.

Example 2

Synthesis of All-Inorganic Perovskite CsPbBr$_3$ Powders (with a Molar Ratio of CsBr to PbBr$_2$ being 4:3)

According to the second example, the all-inorganic perovskite CsPbBr$_3$ powders are prepared through steps of:

dissolving 15 mmol PbBr$_2$ in 30 ml HBr, stirring at 50° C. for 10 minutes until fully dissolved, and obtaining a solution A2; dissolving 20 mmol CsBr in 10 ml deionized water, stirring at 50° C. for 10 minutes until fully dissolved, and obtaining a solution B2; rapidly adding the solution B2 into the solution A2, stirring for 1 minute until completely reacted, and observing that yellow powders are precipitated at bottom of the beaker; washing the obtained precipitates with methyl alcohol; after suction filtration, obtaining the pure all-inorganic perovskite $CsPbBr_3$ powders; annealing the obtained powders in an inert atmosphere at 60° C. for 40 minutes, so as to remove the residual methyl alcohol, and obtaining the dry i-type all-inorganic perovskite $CsPbBr_3$ powders.

Example 3

Synthesis of All-Inorganic Perovskite $CsPbBr_3$ Powders (with a Molar Ratio of CsBr to $PbBr_2$ being 1:1)

According to the third example, the all-inorganic perovskite $CsPbBr_3$ powders are prepared through steps of:
dissolving 20 mmol $PbBr_2$ in 30 ml HBr, stirring at 50° C. for 10 minutes until fully dissolved, and obtaining a solution A3; dissolving 20 mmol CsBr in 10 ml deionized water, stirring at 50° C. for 10 minutes until fully dissolved, and obtaining a solution B3; rapidly adding the solution B3 into the solution A3, stirring for 1 minute until completely reacted, and observing that yellow powders are precipitated at bottom of the beaker; washing the obtained precipitates with methyl alcohol; after suction filtration, obtaining the pure all-inorganic perovskite $CsPbBr_3$ powders; annealing the obtained powders in an inert atmosphere at 80° C. for 20 minutes, so as to remove the residual methyl alcohol, and obtaining the dry i-type all-inorganic perovskite $CsPbBr_3$ powders.

In the above examples 1-3, the molar ratios of CsBr to $PbBr_2$ are respectively 2:1, 4:3 and 1:1. An XRD characterization analysis is made on the all-inorganic perovskite $CsPbBr_3$ powders obtained under different proportions through the examples 1-3, and results thereof are showed in FIG. 1. It can be seen from FIG. 1 that: the all-inorganic perovskite $CsPbBr_3$ synthesized through the example 1 is pure phase and has the best powder quality, and no perovskite-like $CsPb_2Br_5$ impurity is found.

Example 4

Synthesis of All-Inorganic Perovskite $CsPbI_3$ Powders (with a Molar Ratio of CsI to $PbI_2$ being 1:1)

Dissolving 20 mmol $PbI_2$ in 30 ml HI, stirring at 50° C. for 10 minutes until fully dissolved, and obtaining a solution A4; dissolving 20 mmol CsI in 10 ml deionized water, stirring at 50° C. for 10 minutes until fully dissolved, and obtaining a solution B4; rapidly adding the solution B4 into the solution A4, stirring for 1 minute until completely reacted, and observing that yellow powders are precipitated at bottom of the beaker; washing the obtained precipitates with methyl alcohol; after suction filtration, obtaining the pure all-inorganic perovskite $CsPbI_3$ powders; annealing the obtained powders in an inert atmosphere at 70° C. for 30 minutes, so as to remove the residual methyl alcohol, and obtaining the dry i-type all-inorganic perovskite $CsPbI_3$ powders.

Example 5

Figure 2:
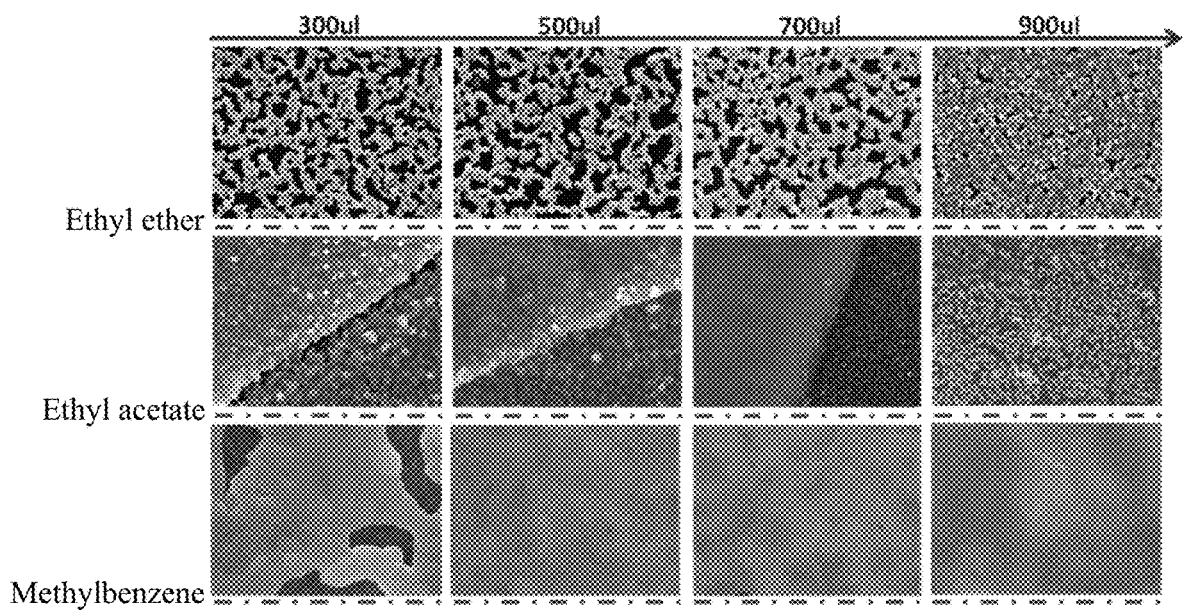
FIG. 2 shows SEM (Scanning Electron Microscope) surface micrographs of all-inorganic perovskite CsPbBr$_3$ polycrystalline films synthesized with anti-solvents of different types and dosages in examples 5-8.

Synthesis of All-Inorganic Perovskite $CsPbBr_3$ with Anti-Solvent of 300 µl Ethyl Ether (1) ultrasonically cleaning clear glass respectively with deionized water, acetone and alcohol for 15 minutes, and then processing with ultraviolet and ozone for 30 minutes;

(2) preparing an all-inorganic perovskite $CsPbBr_3$ polycrystalline film, particularly comprising steps of:
dissolving the all-inorganic perovskite $CsPbBr_3$ powders successfully prepared through the example 1 in DMSO; after standing for 2 hours, filtering by a filter with a pore size of 0.22 µm, and obtaining a colorless transparent solution; thereafter, dropping a small amount of the colorless transparent solution uniformly on a GaN base layer, and running for 60 seconds with a rotation speed of 4000 rpm;

(3) adding an anti-solvent during preparation of the polycrystalline film, particularly comprising steps of:
after running for 25 seconds, dropping 300 µl ethyl ether on the rotary GaN base layer;

(4) annealing, particularly comprising steps of:
placing an obtained sample in an argon atmosphere, and annealing at 100° C. for 10 minutes, so as to improve crystallinity of the all-inorganic perovskite $CsPbBr_3$ polycrystalline film; and (5) testing, particularly comprising steps of:
carrying out a SEM analysis for the obtained polycrystalline film sample, wherein results thereof are showed in FIG. 2.

Example 6

Synthesis of All-Inorganic Perovskite $CsPbBr_3$ with Ethyl Ether in Other Dosages The preparation method for the all-inorganic perovskite $CsPbBr_3$ in the example 6 is basically the same as that in the example 4 and is different from the example 4 only in that: in the step (3) of the example 6, 500 µl, 700 µl and 900 µl ethyl ether are respectively adopted as the anti-solvent for synthesizing the all-inorganic perovskite $CsPbBr_3$.

Example 7

Synthesis of All-Inorganic Perovskite $CsPbBr_3$ with Anti-Solvent of Ethyl Acetate The preparation method for the all-inorganic perovskite $CsPbBr_3$ in the example 7 is basically the same as that in the example 4 and is different from the example 4 only in that: in the step (3) of the example 7, 300 µl, 500 µl, 700 µl and 900 µl ethyl acetate are respectively adopted as the anti-solvent for synthesizing the all-inorganic perovskite $CsPbBr_3$.

Example 8

Synthesis of All-Inorganic Perovskite $CsPbBr_3$ with Anti-Solvent of Methylbenzene The preparation method for the all-inorganic perovskite $CsPbBr_3$ in the example 8 is basically the same as that in the example 4 and is different from the example 4 only in that: in the step (3) of the example 8, 300 µl, 500 µl, 700 µl and 900 µl methylbenzene are respectively adopted as the anti-solvent for synthesizing the all-inorganic perovskite $CsPbBr_3$.

The SEM analysis is carried out for the all-inorganic perovskite $CsPbBr_3$ polycrystalline film samples obtained through examples 5-8, and the results thereof are showed in FIG. 2. It can be seen from FIG. 2 that: the polycrystalline films obtained through adding 500 µl and 700 µl methylbenzene have a relatively good quality and less pores.

The anti-solvent is able to reduce the saturability of perovskite in DMSO, and accelerate the homogeneous nucleation of the perovskite film. It should be noted that: the function of the anti-solvent is only for reducing, not for eliminating. Therefore, the type and the dosage of the anti-solvent are particularly important. When the dosage is too less, the acceleration effect is unobvious (such as 100 μl); when the dosage is too much (such as 900 μl), the anti-solvent will bring the solution DMSO away and causes the oversaturated solution and many nucleation sites, resulting the poor film effect. Thus, there exists an optimal amount.

The all-inorganic perovskite $CsPbBr_3$ film, which is successfully prepared by the present invention, is applied in the photoelectric device. With utilizing the hole conduction ability of the carbon electrode, the n-GaN monocrystal is designed as the electron transfer layer, and the $CsPbBr_3$ film is adopted as the active layer, which avoids the photoelectric device of hole transport layer. When no external bias is applied, because the Fermi level positions of GaN and $CsPbBr_3$ are different, after contacting, the charge transfers and the junction barrier is formed. Moreover, because the exciton binding energy of the all-inorganic perovskite $CsPbBr_3$ is relatively small, the separation of excitons is facilitated and the photocurrent is formed, so that the optical detection is realized under a condition without the external bias. Because of the different lattice constant and stress effect of GaN and $CsPbBr_3$, the energy band bends at the interface, a trough occurs at the $CsPbBr_3$ side, and a peak occurs at the GaN side. A large number of electrons are accumulated at the trough; when a positive bias is applied, the holes injected from the positive electrode are recombined with the electrons at the trough for electroluminescence. Therefore, the functions of green LED and visible light detection can be successfully integrated on one device.

Example 9

Preparation of Light-Responsive LED Based on GaN/$CsPbBr_3$ Heterojunction (1) washing a GaN base layer, particularly comprising steps of:
ultrasonically cleaning the GaN base layer respectively with deionized water, acetone and alcohol for 15 minutes, and then processing with ultraviolet and ozone for 30 minutes;

(2) preparing an indium bottom electrode, particularly comprising steps of:
melting indium particles by an electric soldering iron; coating molten indium uniformly on one side of the GaN base layer; cooling to a room temperature, and obtaining the indium bottom electrode;

(3) generating an all-inorganic perovskite $CsPbBr_3$ polycrystalline film with an anti-solvent, particularly comprising steps of:
dissolving 0.48 g all-inorganic perovskite $CsPbBr_3$ powders successfully prepared through the example 1 in 2.2 g DMSO; after standing for 2 hours, filtering by a filter with a pore size of 0.22 μm, and obtaining a colorless transparent solution; thereafter, dropping a small amount of the colorless transparent solution uniformly on the GaN base layer, and running for 60 seconds with a rotation speed of 4000 rpm, wherein 500 μl anti-solvent of methylbenzene is dropped on the GaN base layer after running for 25 seconds; finally, placing an obtained sample in an argon atmosphere, and annealing at 100° C. for 10 minutes, so as to improve crystallinity of the all-inorganic perovskite $CsPbBr_3$ film;

(4) preparing a carbon top electrode, particularly comprising steps of:
selecting carbon paste, wherein the carbon paste is purchased from Shenzhen Dongdalai Chemical Co., Ltd. and not processed after purchasing; with using a mask having an area of 0.04 $cm^2$, blade-coating the carbon paste on the sample; and finally, placing the sample in an argon atmosphere, and annealing at 100° C. for 30 minutes, so as to remove solvent in the carbon paste; and (5) testing, particularly comprising steps of:
after finishing testing, obtaining a complete light-responsive LED device.

Figure 3:
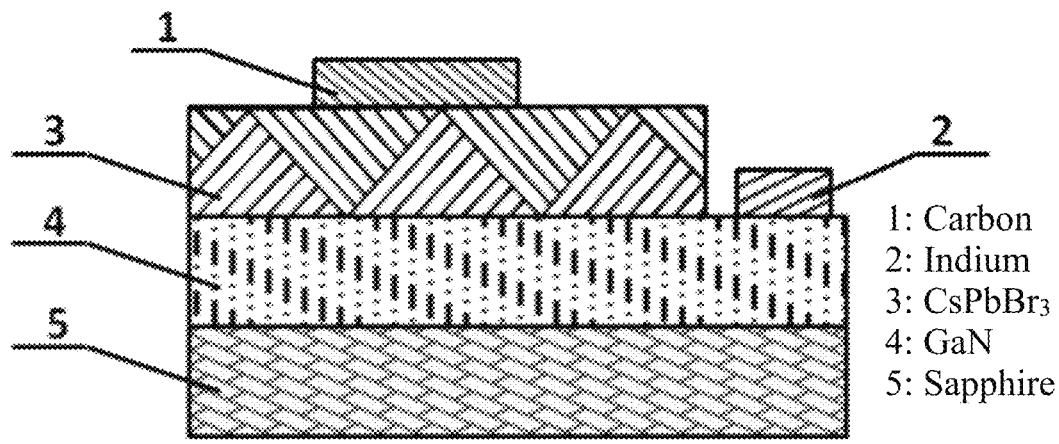
FIG. 3 is a structural diagram of a light-responsive LED (Light Emitting Diode) based on a GaN/CsPbBr$_3$ heterojunction prepared in example 9.

A structure of the light-responsive LED based on the GaN/$CsPbBr_3$ heterojunction prepared through the example 9 is showed in FIG. 3.

Figure 4:
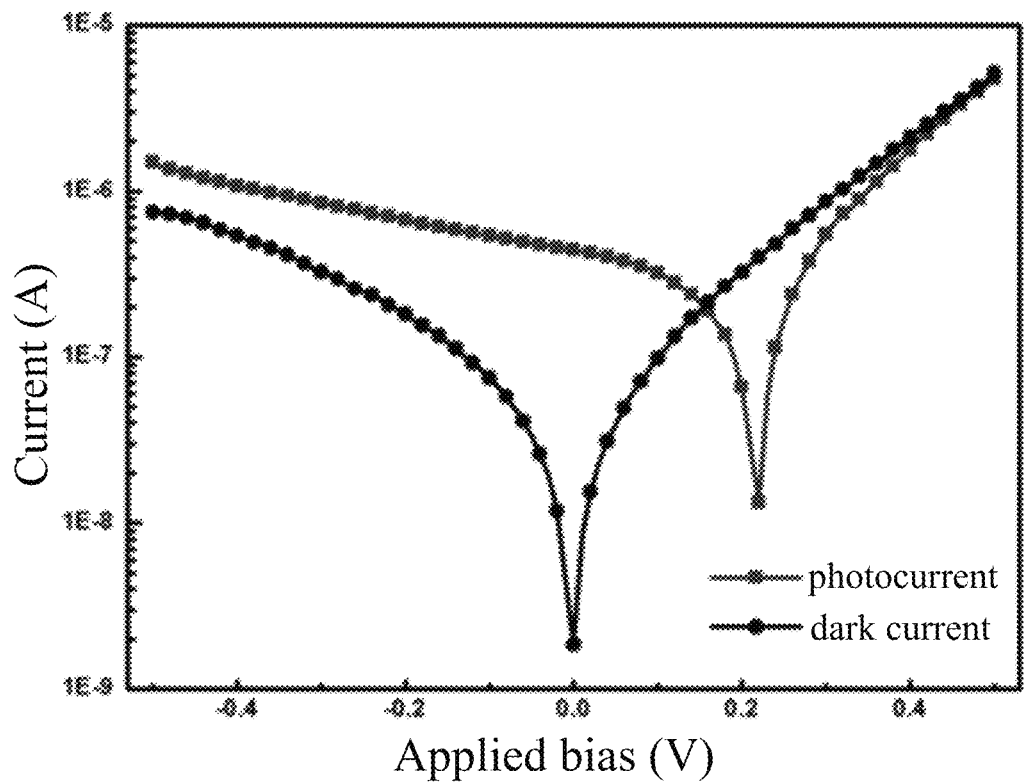
FIG. 4 shows current-voltage (I-V) curves of the light-responsive LED prepared in the example 9 under dark and illumination.

FIG. 4 shows current-voltage (I-V) curves of the light-responsive LED prepared in the example 9 under dark and illumination. It can be seen from FIG. 4 that: comparing the I-V curves of the device under dark and illumination, the difference between the values of the current is relatively large when the bias is 0V (without the external bias), illustrating that the device has the ability of self-powered detection.

Figure 5:
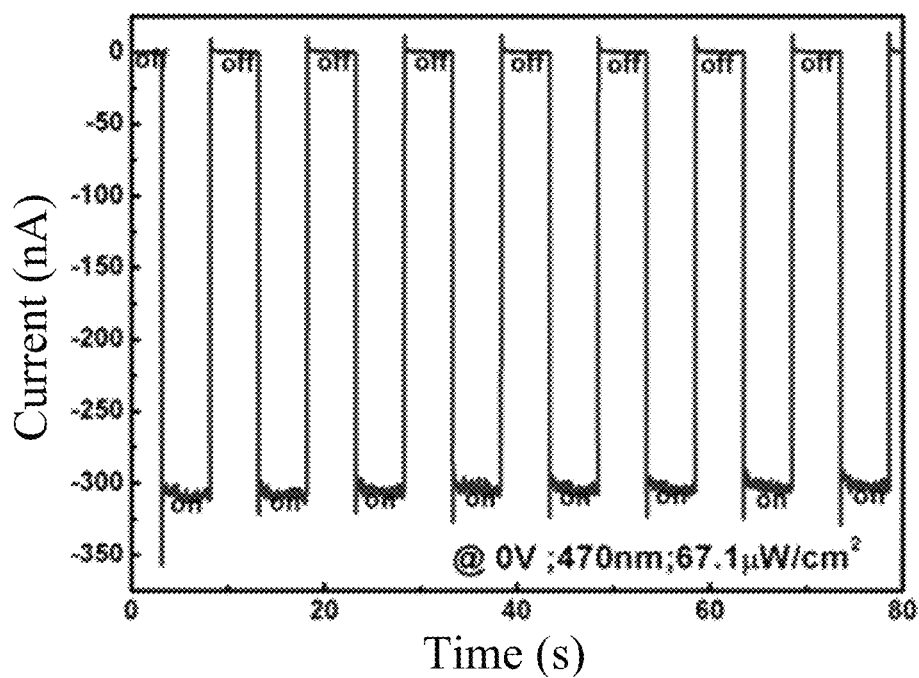
FIG. 5 shows current-time (I-T) curves of the light-responsive LED prepared in the example 9 with periodical on/off illumination.

FIG. 5 shows current-time (I-T) curves of the light-responsive LED prepared in the example 9 with periodical on/off illumination. It can be seen from FIG. 5 that: the current of the device periodically increases and decreases with periodical on/off illumination, illustrating that the device works stably.

Figure 6:
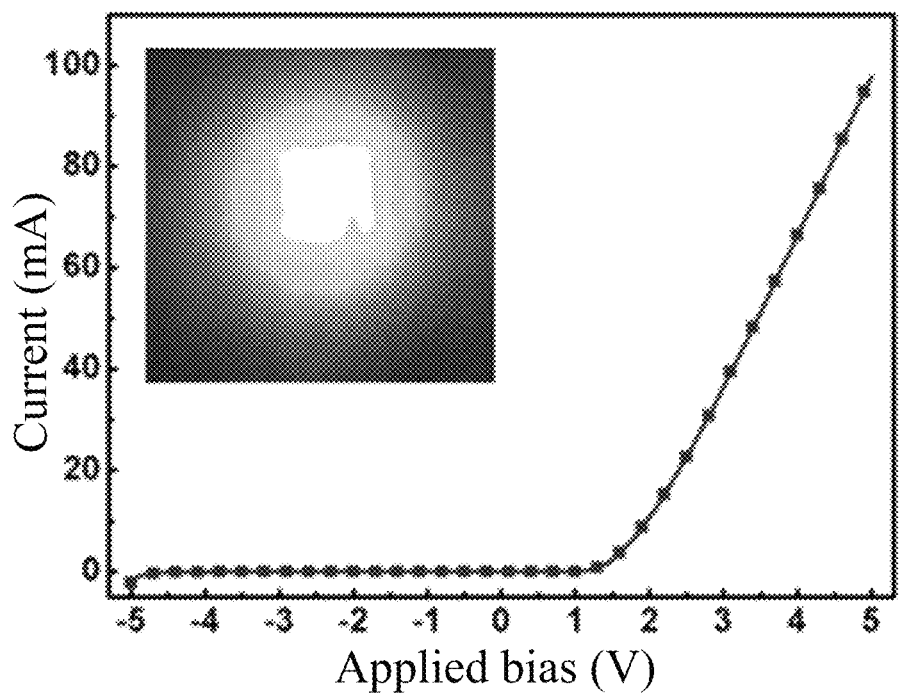
FIG. 6 shows an electroluminescent I-V curve of the light-responsive LED prepared in the example 9.

FIG. 6 shows an electroluminescent I-V curve of the light-responsive LED prepared through the example 9. It can be seen from FIG. 6 that the device has a good rectification property. The device belongs to a diode, and the illustration in FIG. 6 is an actual picture of the luminous light-responsive LED.

Figure 7:
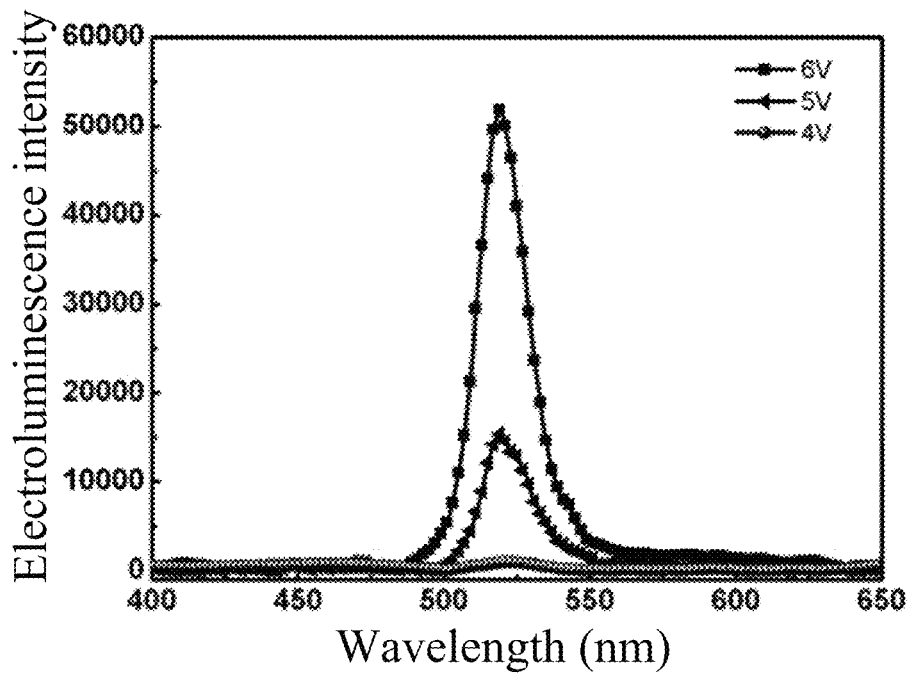
FIG. 7 is an electroluminescent spectrum of the light-responsive LED prepared in the example 9.

FIG. 7 is an electroluminescent spectrum of the light-responsive LED prepared through the example 9. It can be seen from FIG. 7 that: the luminescence of the device is concentrated at the green light waveband.

Figure 8:
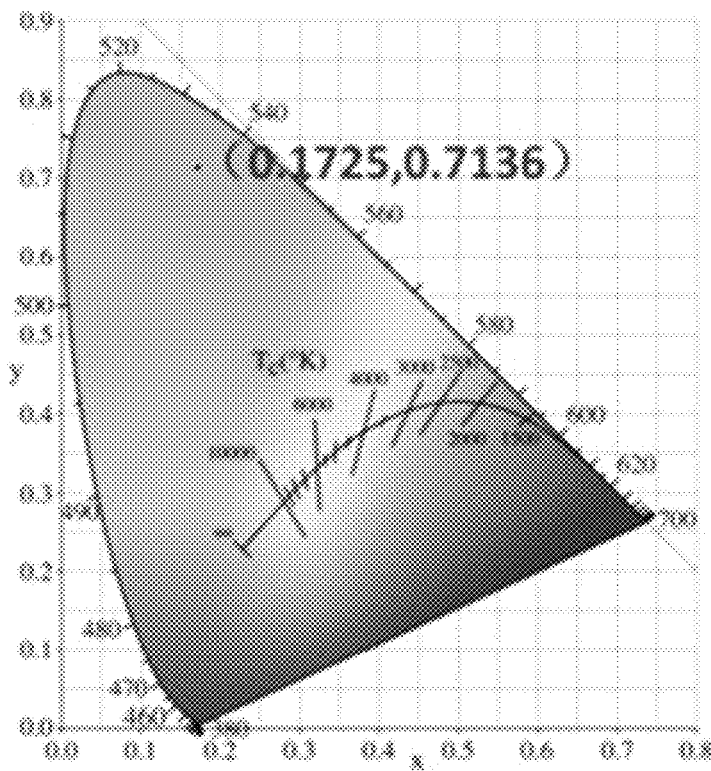
FIG. 8 shows a point plotted on CIE (Commission Internationale de L'Edairage) chromaticity coordinates from the light-responsive LED prepared in the example 9.
Figure 9:
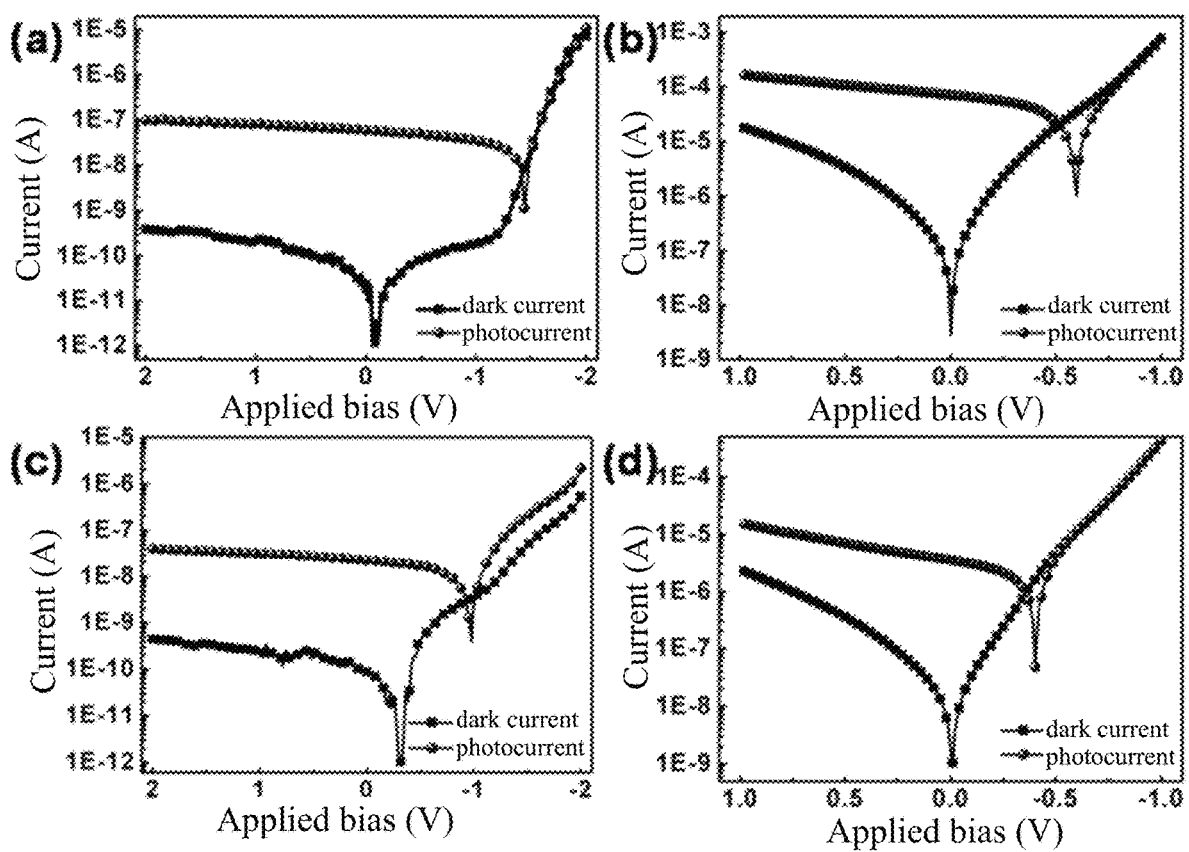
FIG. 9(a) shows I-V curves of the light-responsive LED based on the GaN/CsPbBr$_3$ heterojunction prepared in the example 9.
FIG. 9(b) shows I-V curves of a light-responsive LED based on a GaN/CsPbBr$_{1.5}$I$_{1.5}$ heterojunction prepared in example 10.
FIG. 9(c) shows I-V curves of a light-responsive LED based on a GaN/CsPbBr$_{0.75}$I$_{2.25}$ heterojunction prepared in example 11.
FIG. 9(d) shows I-V curves of a light-responsive LED based on a GaN/CsPbI$_3$ heterojunction prepared in example 12.

FIG. 8 shows a point plotted on CIE (Commission Internationale de L'Edairage) chromaticity coordinates from the light-responsive LED prepared through the example 9. It can be seen from FIG. 8 that: the light is pure green light.

Example 10

Preparation of Light-Responsive LED Based on GaN/$CsPbBr_{1.5}I_{1.5}$ Heterojunction The preparation method for the light-responsive LED in the example 10 is basically the same as that in the example 9 and is different from the example 9 only in that: in the step (3) of the example 10, the all-inorganic perovskite $CsPbBr_3$ powders and $CsPbI_3$ powders (with a weight ratio of $CsPbBr_3$ to $CsPbI_3$ being 1:1) are adopted as raw materials, for preparing the $CsPbBr_{1.5}I_{1.5}$ polycrystalline film.

Example 11

Preparation of Light-Responsive LED Based on GaN/$CsPbBr_{0.75}I_{2.25}$ Heterojunction The preparation method for the light-responsive LED in the example 11 is basically the same as that in the example 9 and is different from the example 9 only in that: in the step (3) of the example 11, the all-inorganic perovskite $CsPbBr_3$ powders and $CsPbI_3$ powders (with a weight ratio of $CsPbBr_3$ to $CsPbI_3$ being 1:3) are adopted as raw materials, for preparing the $CsPbBr_{0.75}I_{2.25}$ polycrystalline film.

Example 12

Preparation of Light-Responsive LED Based on GaN/CsPbI$_3$ Heterojunction

The preparation method for the light-responsive LED in the example 12 is basically the same as that in the example 9 and is different from the example 9 only in that: in the step (3) of the example 12, the all-inorganic perovskite $CsPbI_3$ powders are adopted as raw materials, for preparing the $CsPbI_3$ polycrystalline film.

FIG. 9(a), FIG. 9(b), FIG. 9(c) and FIG. 9(d) respectively show I-V curves of the light-responsive LEDs prepared through the examples 9-12. Comparing the currents of the device under dark and illumination in FIGS. 9(a)-(d), it is found that: the photocurrent and the dark current have significant differences under 0V and the reverse bias, illustrating that the device based on the GaN/CsPbBr$_x$I$_{3-x}$ heterojunction can carry out the optical detection.

Figure 10:
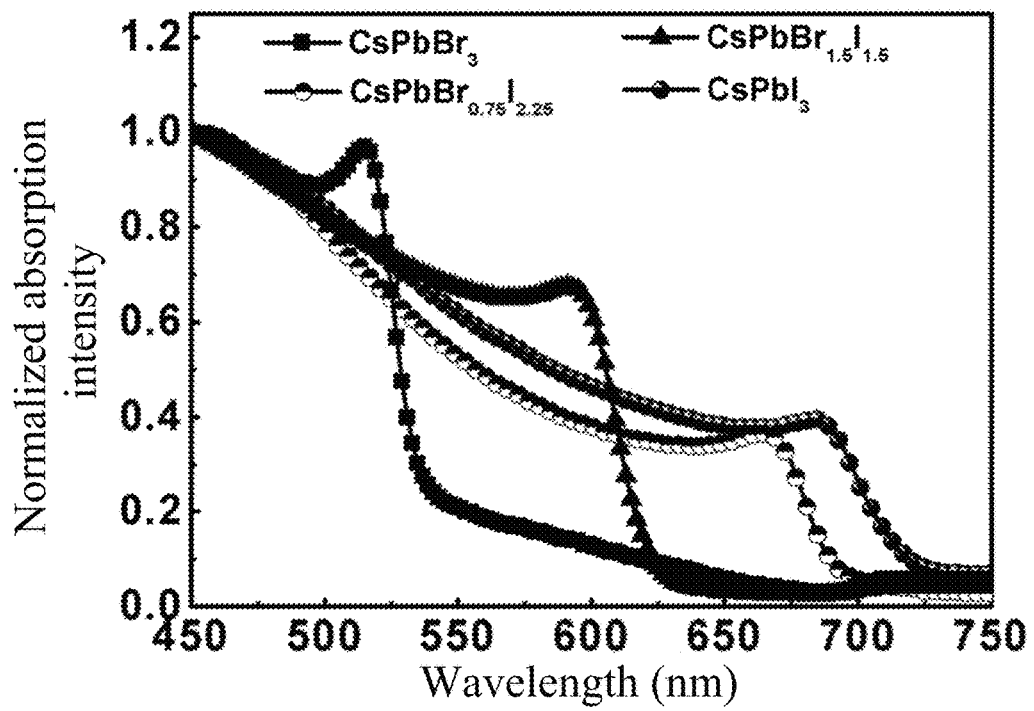
FIG. 10 shows normalized light absorption curves of the light-responsive LEDs prepared in the examples 9-12 at various wavelengths.
Figure 11:
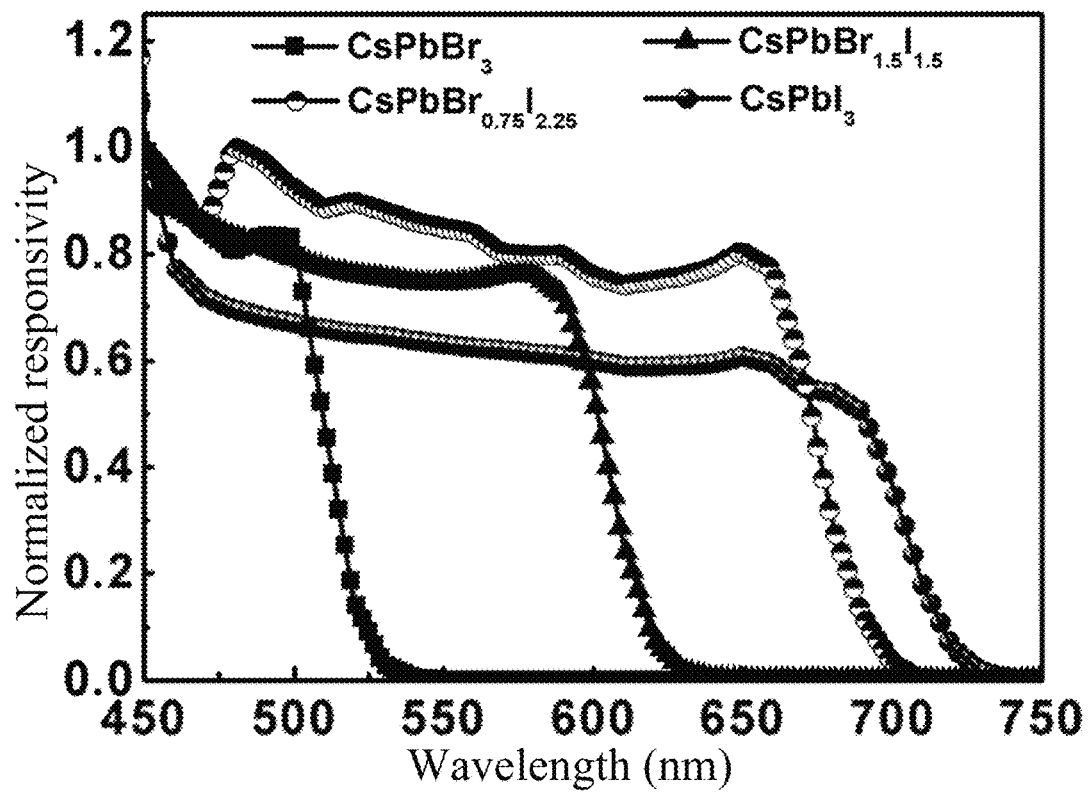
FIG. 11 shows normalized responsivities of the light-responsive LEDs prepared in the examples 9-12 at various wavelengths.
Figure 12:
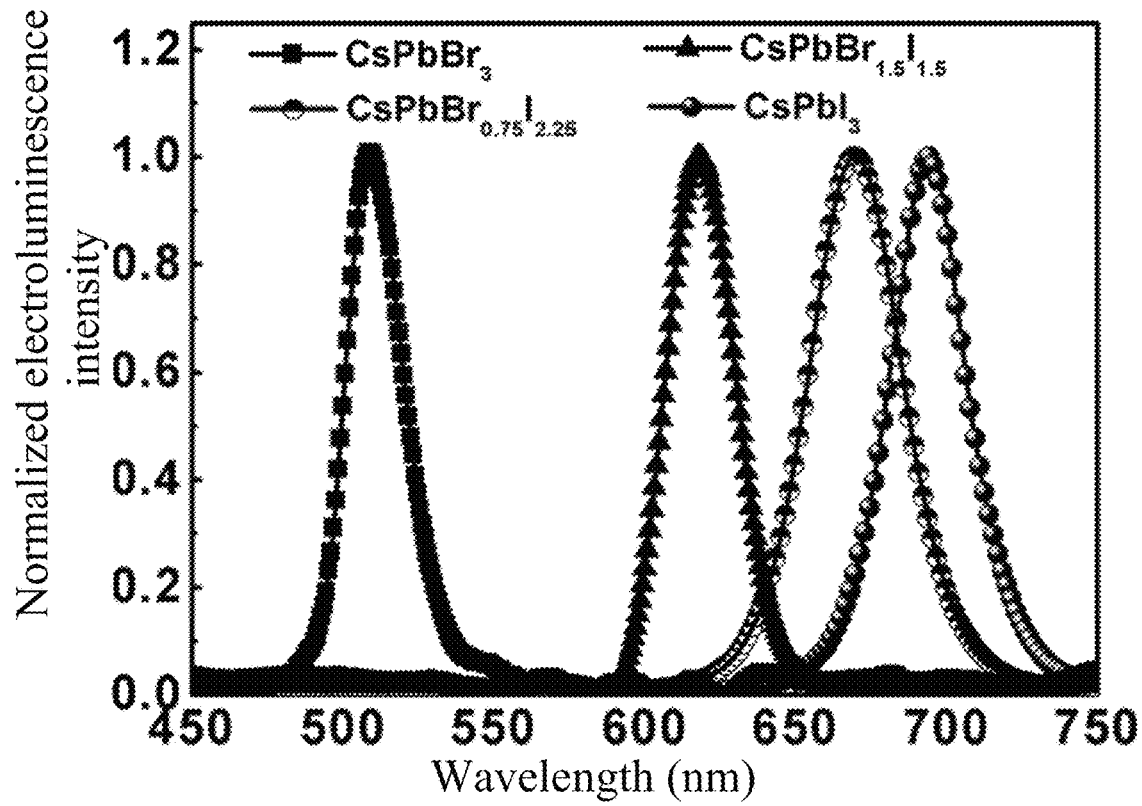
FIG. 12 shows electroluminescent spectra of the light-responsive LEDs prepared in the examples 9-12.

FIG. 10 shows normalized light absorption curves of the light-responsive LEDs prepared through the examples 9-12 at various wavelengths. FIG. 11 shows normalized responsivities of the light-responsive LEDs prepared through the examples 9-12 at various wavelengths. FIG. 12 shows electroluminescent spectra of the light-responsive LEDs prepared through the examples 9-12. It can be seen from FIG. 10 that: the devices provided by the present invention can carry out the optical detection, illustrating that changing the halogen proportion is an effective way to control the detection wavelength range. Thereafter, in order to verify that the device also has an ability of luminescence, the electroluminescent characteristics of the corresponding devices are tested, as shown in FIG. 12. It can be seen from FIG. 12 that: when the amount of iodine increases, the device trends to emit the red light. In conclusion, it is successfully proved by above figures that: from green to red, the electroluminescence and the detection wavelength of the device can be controlled.

Application Example 1

Figure 13:
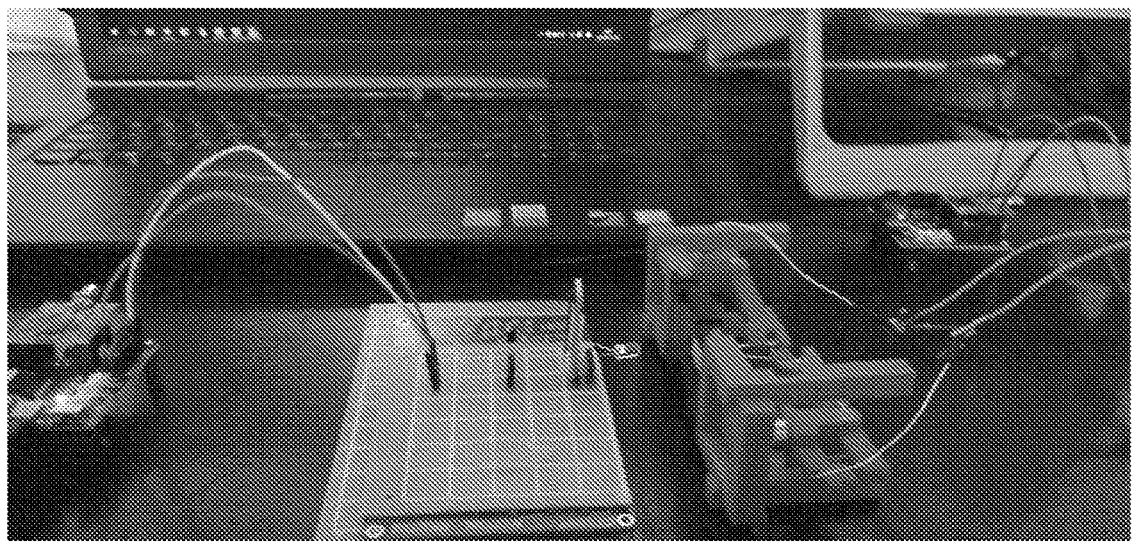
FIG. 13 shows an actual demonstration of a visible light communication device in application example 1.
Figure 14:
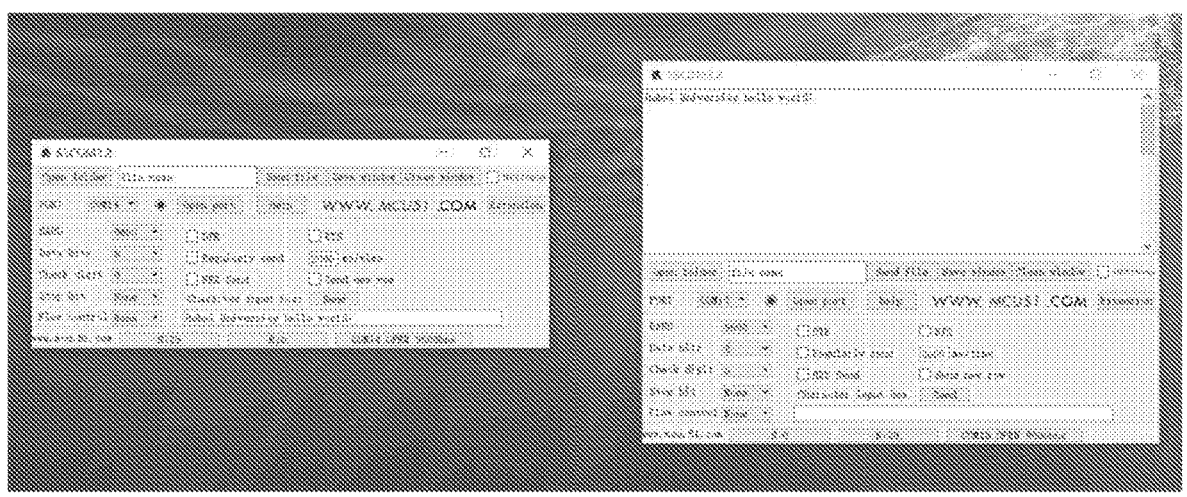
FIG. 14 shows an actual demonstration of a transmission behavior in visible light communication in the application example 1.

Verifying that the Light-Responsive LED Based on the GaN/CsPbBr$_3$ Heterojunction Prepared Through the Example 9 can be Adopted as a Receiving Terminal in Visible Light Communication In order to establish a visible light communication system, the commercial blue LED is adopted as the transmitting terminal, and the light-responsive LED based on the GaN/CsPbBr$_3$ heterojunction is adopted as the receiving terminal. Blue light is transmitted through the blue LED, and the light-responsive LED receives the signal, which is defined as 1; otherwise, when the blue LED does not transmit the blue light, it is defined as 0. Finally, a transmission of characters "Hubei University hello world!" is realized. FIG. 13 shows an actual demonstration of the visible light communication device in the application example 1. FIG. 14 shows an actual demonstration of a transmission behavior in visible light communication in the application example 1.

Application Example 2

Figure 15:
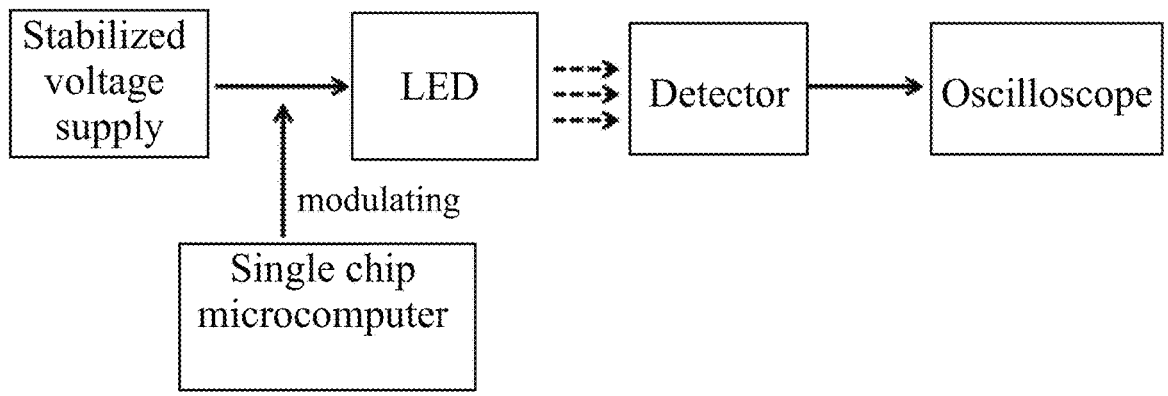
FIG. 15 is a diagram of a visible light communication system in application example 2.
Figure 16:
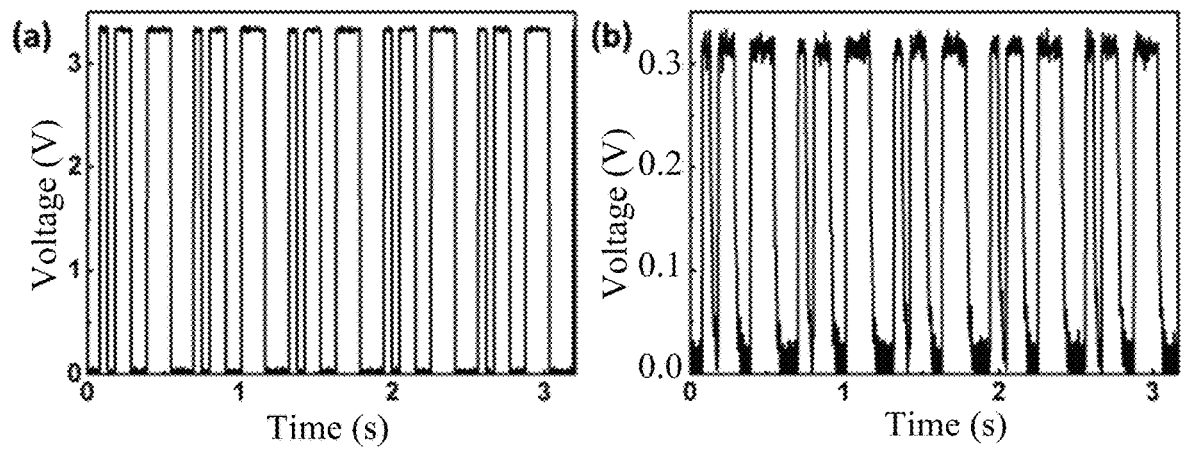
FIG. 16(a) shows a waveform generated by a single chip microcomputer in the application example 2.
FIG. 16(b) shows a waveform received by the light-response LED in the application example 2.

Verifying that the Light-Responsive LED Based on the GaN/CsPbBr$_3$ Heterojunction Prepared Through the Example 9 can be Adopted as a Transmitting Terminal in Visible Light Communication In the application example 2, a simple visible light communication system is established (as shown in FIG. 15). A stabilized voltage supply is adopted as a power supply for supplying power to the prepared light-responsive LED based on the GaN/CsPbBr$_3$ heterojunction, and a single chip microcomputer is adopted for modulating the voltage, so that the inputted electric signal becomes a periodic signal successively of 50 ms high level, 50 ms low level, 100 ms high level, 100 ms low level, 150 ms high level, and 150 ms low level. Therefore, the transmitted light by the LED also becomes the modulating signal. Thereafter, the standard silicone detector is adopted as the receiving terminal, and the oscilloscope is adopted for the outputted signal by the standard silicone detector. Finally, comparing the input signal and the output signal, it is found that the two signals are basically the same (as shown in FIG. 16(a) and FIG. 16(b)), proving that the light-responsive LED based on the GaN/CsPbBr$_3$ heterojunction can be adopted as a transmitting terminal in the visible light communication.

What is claimed is:

1. A preparation method for a light-responsive LED based on a GaN/CsPbBr$_x$I$_{3-x}$ heterojunction, comprising steps of:
(1) selecting a GaN base layer and washing, particularly comprising steps of:
selecting a GaN base layer on a sapphire substrate, and ultrasonically cleaning; then processing with ultraviolet and ozone, and obtaining a preprocessed GaN base layer;
(2) preparing an indium bottom electrode, particularly comprising steps of:
coating molten indium uniformly on one side of the preprocessed GaN base layer obtained through the step (1); cooling to a room temperature, and obtaining the indium bottom electrode;
(3) generating an all-inorganic perovskite CsPbBr$_x$I$_{3-x}$ polycrystalline film with an anti-solvent, particularly comprising steps of:
according to a proportion, successively dissolving all-inorganic perovskite CsPbBr$_3$ powders and CsPbI$_3$ powders in DMSO (dimethylsulfoxide); after standing for 1-3 hours, filtering by a filter, and obtaining a colorless transparent solution; thereafter, dropping a small amount of the colorless transparent solution uniformly on the other side of the GaN base layer; placing the GaN base layer on a spin coater, and running for 40-80 seconds with a rotation speed of 3000-5000 rpm, wherein the anti-solvent is dropped on the GaN base layer after running for 15-30 seconds; placing an obtained sample in an inert atmosphere, and annealing at 80-120° C. for 5-15 minutes; and obtaining the all-inorganic perovskite CsPbBr$_x$I$_{3-x}$ polycrystalline film;
(4) preparing a carbon top electrode, particularly comprising steps of:
with using a mask, blade-coating carbon paste on the CsPbBr$_x$I$_{3-x}$ polycrystalline film obtained through the step (3); placing the sample in an argon atmosphere, and annealing, so as to remove solvent in the carbon paste; and (5) testing, particularly comprising steps of:
after finishing testing, obtaining a complete LED device; wherein: the obtained LED consists of the GaN base layer on the sapphire substrate, the all-inorganic perovskite $CsPbBr_xI_{3-x}$ polycrystalline film, the indium bottom electrode and the carbon top electrode, forming an In/GaN/$CsPbBr_xI_{3-x}$/C structure; in the $CsPbBr_xI_{3-x}$ polycrystalline film, 0<x<3; the all-inorganic perovskite $CsPbBr_xI_{3-x}$ polycrystalline film and the indium bottom electrode are arranged on the GaN base layer in parallel; and the carbon top electrode is arranged on the all-inorganic perovskite $CsPbBr_xI_{3-x}$ polycrystalline film.

2. The preparation method, as recited in claim 1, wherein: in the step (3), a weight ratio of the $CsPbBr_3$ powders to the $CsPbI_3$ powders is 1:0, 1:1, 1:3, or 0:1.

3. The preparation method, as recited in claim 1, wherein: in the step (3), the anti-solvent is ethyl ether, ethyl acetate, or methylbenzene.

4. The preparation method, as recited in claim 1, wherein: in the step (3), the all-inorganic perovskite $CsPbBr_3$ powders are prepared through steps of:
dissolving $PbBr_2$ in an appropriate amount of HBr, heating and stirring until fully dissolved, and obtaining a solution A; dissolving CsBr in an appropriate amount of deionized water, heating and stirring until fully dissolved, and obtaining a solution B; rapidly adding the solution B into the solution A, stirring until completely reacted, and obtaining yellow powdery precipitates; washing the precipitates with methyl alcohol or ethyl alcohol; after suction filtration, annealing obtained powders in an inert atmosphere at 60-80° C. for 20-40 minutes, so as to remove the residual methyl alcohol or ethyl alcohol, and obtaining the all-inorganic perovskite $CsPbBr_3$ powders.

5. The preparation method, as recited in claim 4, wherein: a molar ratio of $PbBr_2$ to CsBr is 1:2.

* * * * *